United States Patent [19]

Jacobs

[11] Patent Number: 4,571,826
[45] Date of Patent: Feb. 25, 1986

[54] METHOD OF MANUFACTURING A THERMAL PRINT HEAD

[75] Inventor: Norman A. Jacobs, Arlington Heights, Ill.

[73] Assignee: AT&T Teletype Corporation, Skokie, Ill.

[21] Appl. No.: 672,638

[22] Filed: Nov. 19, 1984

[51] Int. Cl.4 ............................ H05K 3/34; H05K 3/30
[52] U.S. Cl. ........................................ 29/840; 29/834; 29/589; 156/230; 156/235; 156/241
[58] Field of Search .................. 29/832, 834, 840, 589; 156/230, 235, 241, 344

[56] References Cited

U.S. PATENT DOCUMENTS

| 3,655,496 | 4/1972 | Ettre et al. |
| 3,808,079 | 4/1974 | Akashi et al. |
| 3,846,905 | 11/1974 | Harper |
| 3,847,697 | 11/1974 | Baker et al. |
| 3,859,723 | 1/1975 | Hamer et al. |
| 3,887,996 | 6/1975 | Hartleroad et al. |
| 3,899,379 | 8/1975 | Wanesky |
| 3,950,200 | 4/1976 | Muramoto et al. |
| 3,970,494 | 7/1976 | Pritchard |
| 4,210,462 | 7/1980 | Tourneux |
| 4,329,779 | 5/1982 | England |
| 4,334,354 | 6/1982 | Luft et al. |
| 4,343,833 | 8/1982 | Sawae et al. |
| 4,345,371 | 8/1982 | Ohsawa et al. |
| 4,386,464 | 6/1983 | Yanai et al. |
| 4,466,181 | 8/1984 | Takishima |
| 4,506,272 | 3/1985 | Arai |

Primary Examiner—Howard N. Goldberg
Assistant Examiner—Carl J. Arbes
Attorney, Agent, or Firm—W. K. Serp; A. A. Tirva

[57] ABSTRACT

A method of manufacturing a thermal print head includes the step of coating a channel 12 of a fixture 10 with a first adhesive 26. Integrated circuit packages 20 are placed in the channel 12 with heating elements 22 disposed toward the bottom 14 of the channel 12. The packages 20 are held in position by a jig 30 while the adhesive 26 is thermally activated. A groove 52 in the face of a heat sink 50 is filled with a first part 54 of a two part adhesive and the integrated circuit packages 20 coated with the second part 56 of the two part adhesive. The alignment fixture 10 is positioned over the heat sink 50 activating the two part adhesive. The temperature of the assembly is elevated causing the first adhesive 26 to release and the second adhesive 54, 56 to further cure thus securing the packages 20 to the heat sink 50. Printed circuit cables 60, 70 are soldered to the packages 20.

14 Claims, 10 Drawing Figures

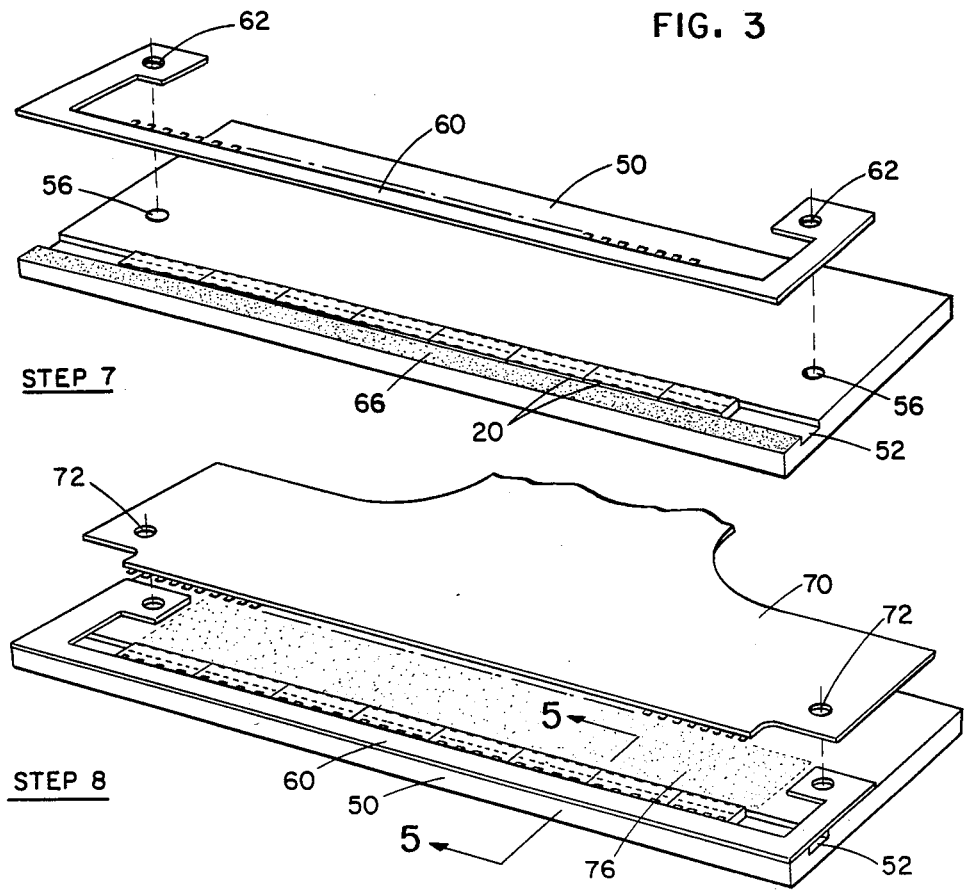
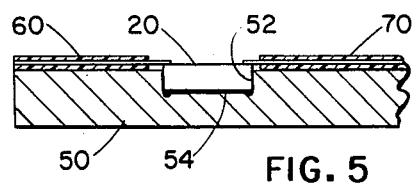
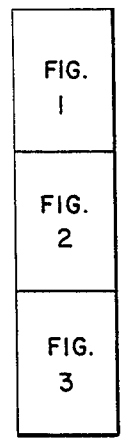

METHOD OF MANUFACTURING A THERMAL PRINT HEAD

TECHNICAL FIELD

This invention generally relates to a method of manufacturing a thermal print head which includes a plurality of interconnected integrated circuit packages positioned in a row.

BACKGROUND OF THE INVENTION

In a thermal printer, a sheet of thermally sensitive paper is moved over small selectively controlled heating elements which cause localized chemical changes in a coating on the paper. The chemically altered areas of the paper are visually discernible thus providing a presentation of the desired information. The heating elements may be configured in various arrangements. Often, the heating elements are housed in a rectangular, relatively flat integrated circuit package with the elements located adjacent one face of the package and arranged in a row. Such an integrated circuit package is described in U.S. patent application Ser. No. 508,315 entitled "A Thermal Print Head" filed June 27, 1983, by C. R. Willcox, now U.S. Pat. No. 4,516,136 issued May 7, 1985, and having a common assignee with this application.

To obtain high speed printing, a complete line of print is produced without movement of the print head i.e. by using a print head having a length equal to the width of the print area of the paper. Due to manufacturing considerations, it is not convenient to produce an integrated circuit package having a length much greater than one inch. Therefore, high speed printing is accomplished with several integrated circuit packages placed ene on end extending across the width of the paper. A particular problem in assembling such a print head is the alignment of the integrated circuit packages. The packages must be precisely positioned and securely mounted. Further, the packages must be carefully aligned to present a uniform surface to the paper and provide a single print row across the paper. To obtain acceptable print quality, the printing surfaces of the packages must exhibit less than one ten thousandths of an inch offset between adjacent packages with similar dimensional tolerances observed between contiguous heating elements of adjacent circuit packages. Additionally, the integrated circuit packages are interconnected to control circuitry, preferably, by means of a conveniently attached cable.

DISCLOSURE OF THE INVENTION

A method of manufacturing a thermal print head for a printer is disclosed. The print head includes a plurality of integrated circuit packages, each having a plurality of heat generating elements arranged in a row adjacent a first surface of the package. An elongated channel, cut into the surface of an alignment fixture, is coated with a heat responsive adhesive coating. The integrated circuit packages are placed into the reference channel with the first surface of each integrated circuit package disposed toward the surface of the channel and with the heat generating elements of each integrated circuit package cell arranged along a common axis. The alignment fixture is placed in a heated environment after which the fixture is cooled allowing the adhesive to securely bond the integrated circuit packages in the reference channel. A groove cut in the surface of a heat sink is filled with a first part of a two part adhesive and the integrated circuit packages coated with the second part of the adhesive. The alignment fixture is positioned with respect to the heat sink, and the integrated circuit packages are placed in the first part of the two part adhesive activating the adhesive. The alignment fixture and heat sink assembly are placed in a heated environment releasing the first adhesive and further curing the second adhesive thereby bonding the integrated circuit packages to the heat sink.

THE DRAWINGS

FIGS. 1, 2 and 3, as arranged in FIG. 4, illustrate a sequential process step for manufacturing a thermal print head; and FIG. 5 is a sectional view taken along the line 5—5 of FIG. 3.

DETAILED DESCRIPTION

Figure 1:
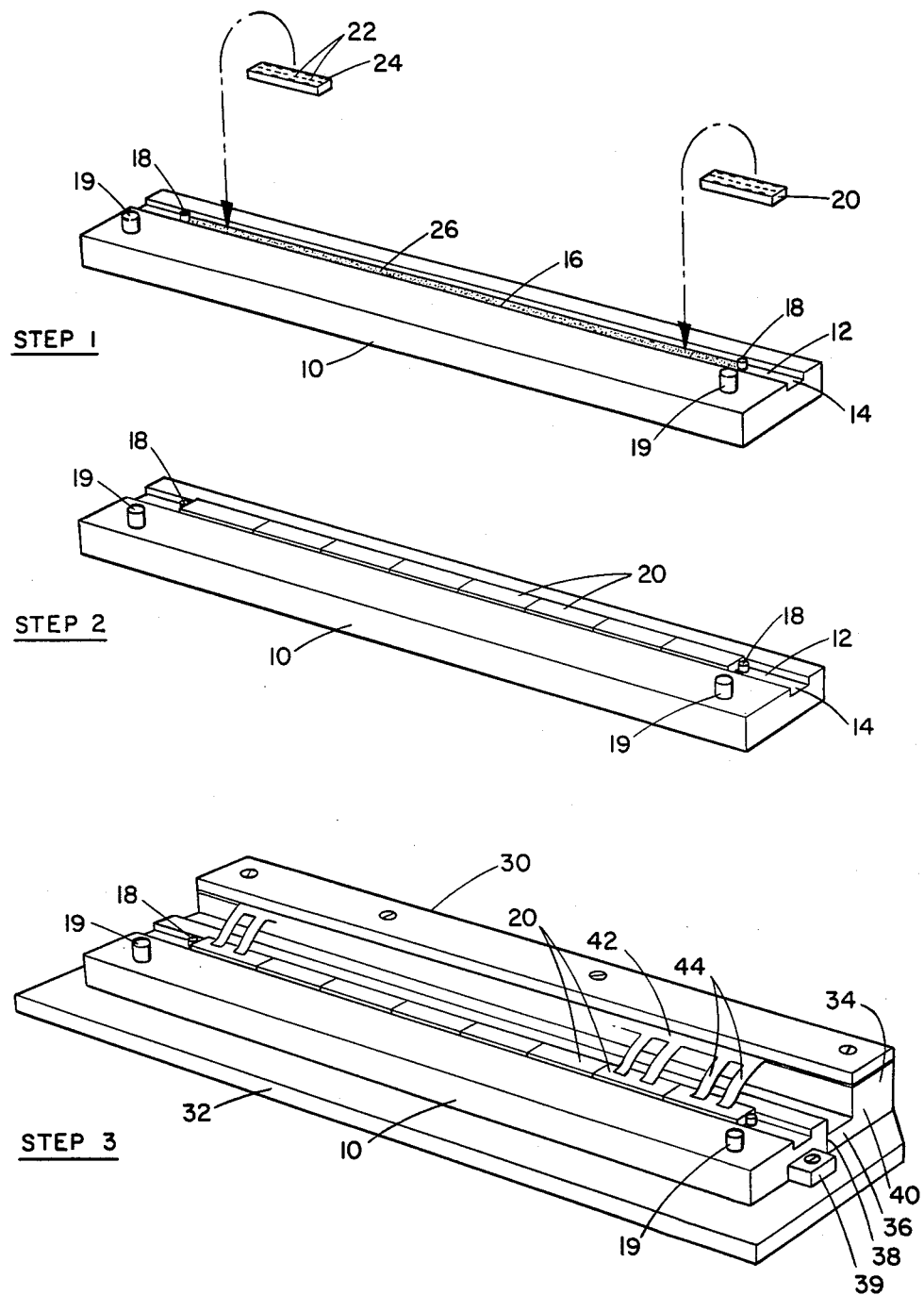
Figure 2:
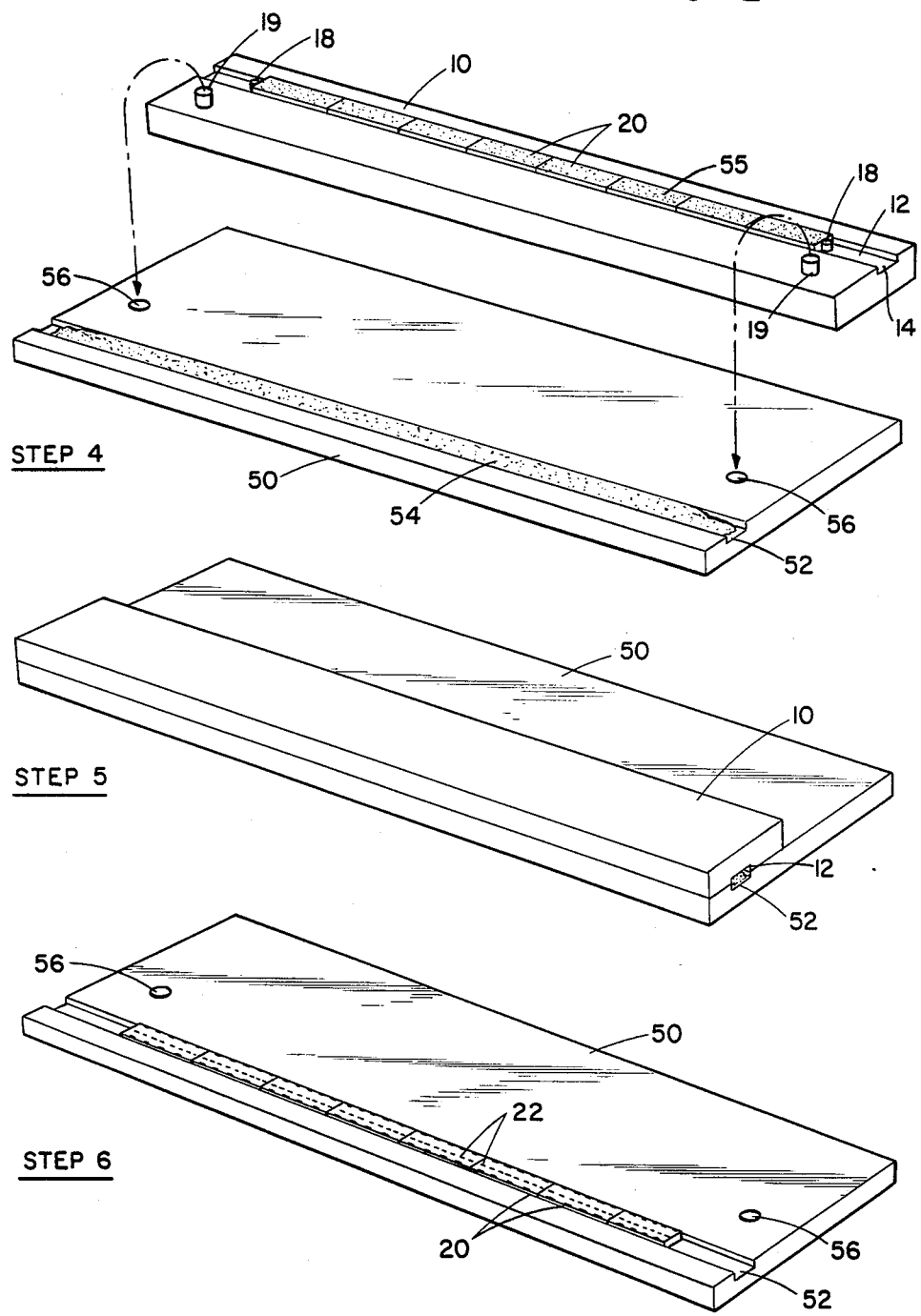

In Step 1, (FIG. 1) an alignment fixture 10 is illustrated with an elongated reference channel 12 cut into the upper face of the fixture 10. The reference channel 12 exhibits a carefully machined bottom surface 14 providing an accurate reference plane and an alignment edge 16. The alignment fixture 10 also includes two spaced alignment posts 19. Spacially positioned within the channel are two reference pins 18 between which are placed eight integrated circuit packages 20 positioned end to end. Each of the integrated circuit packages 20 contain several discrete heating elements 22 aligned in a row and located adjacent a surface 24 of the integrated circuit packages 20. Such an integrated circuit package 20 is illustrated in the aforementioned Willcox patent. Prior to positioning the integrated circuit packages 20 into the reference channel 12 between the reference pins 18, the bottom surface 14 of the channel 12 is coated with an adhesive 26. A particularly suitable adhesive for this purpose is sold under trademark Crystalbond 509, manufactured and sold by Aremco Products, Inc. of Ossining, N.Y. The adhesive 26 is diluted with acetone to assure the application of a thin, uniform coating on the bottom surface 14. After application, the acetone evaporates leaving a thin film of dry adhesive 26.

In Step 2, the integrated circuit packages 20 are positioned end to end within the reference channel 12 with the surface 24 of each package 20 disposed toward the bottom surface 14. The packages 20 are urged forward against the reference edge 16. In Step 3, the alignment fixture 10 is placed in a compression jig 30 which includes a flat rectangular base plate 32 and an L-shaped support 34. A first leg 36 of the support 30 has a reference surface 38 against which the alignment fixture 10 is seated. A stop 39 also positions the alignment fixture 10 with respect to the jig 30. A remaining leg 40 of the L-shaped member 34 supports a leaf spring 42 having a plurality of closely spaced individually deflecting fingers 44. The free ends of the fingers 44 are placed against the upper surfaces of the integrated circuit packages 20 biasing the integrated circuit packages 20 into the channel 14 and against the reference edge 16. The force of the fingers 44 assure that the heating elements 22 on the face of the packages 20 will be in alignment in a row and against the bottom 16 of the reference channel 14. The assembly illustrated in Step 3 is placed in a heated environment and elevated to a temperature of approximately 280 degrees farenheit at which temperature the adhesive 16 softens; and the packages 20, under pressure, are firmly seated in the adhesive 26. The assembly is removed from the furnace, and the adhesive 26 cools thus securing the integrated circuit packages 20 in the reference channel 13.

In Step 4, a heat sink 50 is shown in the form of a rectangular, flat metallic plate defining a groove 52 for receiving the integrated circuit packages 20. The groove 52, as will become more fully appreciated, does not require precise machining. In Step 4, the groove 52 is filled with an excess of one part 54 of a two part adhesive. The second part 55 of the adhesive is painted over the exposed surfaces of the integrated circuit packages. A particular adhesive found suitable is ALTAR Adhesive with activator #707, sold by LOCTITE Corporation, Newington Conn. with activator #707. As shown, the pins 19 are placed in holes 56 in the heat sink 50 and the row of integrated circuit packages 20 embedded in the adhesive 54. Upon contact, the two parts 54 and 55 of the adhesive are activated and allowed to set at room temperature.

In Step 5, the assembly is placed in a heated environment at a temperature of approximately 280 degrees farenheit. The Crystalbond adhesive 26, when reheated, releases the packages 20 from the reference channel 14 of the alignment fixture 10. The LOCTITE adhesive further cures thoroughly securing the integrated circuit packages 20 in the heat sink groove 52. In Step 6, the alignment fixture is removed leaving the integrated circuit packages securely held in the groove 52. The two part adhesive 54, 55 fills any imperfections or non-planar characteristics of the groove 52, and the reference channel 12 establishes the alignment and orientation of the integrated circuit packages 20. It will be appreciated that the upwardly disposed surfaces 24 of the integrated circuit packages 20 lie on a common plane. It has been found that less than 0.0001 inch variation between adjacent package surfaces has been obtained. Further, the heating elements 22 are accurately oriented along a common axis as detemined by the reference channel 12.

In Step 7, a flat cable 60 is soldered to integrated circuit packages 20. The cable 60 is a flexible printed circuit i.e. a sheet of thin KAPTON upon which the desired circuit conductors have been formed. The cable 60 has two spaced holes 62 which are placed in registration with the mounting holes 56 in the heat sink 50. The surface of the heat sink 50 under the cable 60 is coated with a rubber based adhesive 66 which secures the cable to the heat sink 50 at the desired location. Thereafter, the conductive ribbons on the printed circuit are soldered to selected pads on the integrated circuit packages 20. In Step 8, a similarly fabricated printed circuit cable 70, having two spaced holes 72, is positioned on the opposite side of the printed circuit packages 20. The surface area of the heat sink 50, contacted by the cable 70, is also coated with a rubber adhesive 76. The conductors of the cable 70 are soldered to connection pads along the adjacent edge of the integrated circuit packages 20. The final assembly is mounted to the support frame (not shown) of a printer with suitable fasteners placed through the holes 56 securing the thermal print head assembly. The fasteners (not shown) pass through the cables 60 and 70 as well as the heat sink 50 and thus serve as a strain relief for the cables 60 and 70. It will be appreciated, from the sectional view of the assembly illustrated in FIG. 5, that the resulting print head displays a relatively smooth profile which allows movement of paper in close proximity to the integrated circuit packages 20.

Although a single embodiment of this invention has been shown and described, it will be understood that various changes in form and detail may be made without departing from the scope and spirit of the invention as defined by the following claims.

What is claimed is:

1. A method of manufacturing a thermal print head for a printer, the print head includes a plurality of integrated circuit packages, each package has a plurality of heat generating elements arranged in a row upon a first surface thereof, comprising the steps of;
    A. Coating the surface of an elongated channel cut into the surface of an alignment fixture with a heat responsive first adhesive coating;
    B. Placing the integrated circuit packages into said reference channel with the first surface of each integrated circuit package disposed toward the bottom surface of the channel and with the heat generating elements of each integrated circuit package arranged in a row;
    C. Placing the alignment fixture in a heated environment to soften the adhesive for adherence to the packages;
    D. Cooling the alignment fixture causing the adhesive to securely bond the integrated circuit packages in the reference channel;
    E. Placing in an elongated groove cut into the surface of a heat sink a first part of a two part adhesive;
    F. Coating the exposed surfaces of the integrated circuit packages with a second part of said two part adhesive;
    G. Positioning the alignment fixture with respect to said heat sink so that the integrated circuit packages are placed within the groove of the heat sink and in contact with the first part of the two part adhesive thereby activating the two part adhesive; and
    H. Placing the alignment fixture and heat sink assembly in a heated environment to cause the first adhesive in the reference channel to release the integrated circuit packages.

2. The method of claim 1 which further includes the step of:
    I. Biasing the integrated circuit packages into position within the reference channel after Step B and prior to Step C.

3. The method of claim 2 wherein each of the integrated circuit packages are individually biased into the reference channel.

4. The method of claim 2 which further includes the step of:
    J. Soldering a first flexible printed circuit conductor to selected pads on the first surface of said integrated circuit packages.

5. The method of claim 4 which further includes the step of:
    K. Soldering a second flexible printed circuit conductor to selected pads on the first surface of said integrated circuit packages.

6. The method of claim 2 which further includes the step of :
    L. Positioning the alignment fixture with respect to the heat sink in Step G by means of a post and cooperating hole to assure accurate placement of the heat sink with respect to the alignment fixture.

7. The method of claim 5 wherein said first adhesive coating becomes soft at elevated temperatures.

8. The method of claim 5 wherein said two part adhesive cures at elevated temperatures.

9. The method of claim 5 wherein each of said printed circuit conductors has at least one hole placed in registration with a hole in the heat sink to facilitate mounting of the assembly to a cooperating printer chassis by a fastener passing through said holes.

10. The method of claim 1 which further includes the step of:

M. Soldering a first flexible printed circuit conductor to selected pad locations along a first edge of the exposed surface of said integrated circuit packages.

11. The method of claim 10 which further includes the step of:

N. Soldering a second flexible printed circuit conductor to selected pads along a second edge of the exposed surface of the integrated circuit packages.

12. The method of claim 11 wherein said first adhesive is Crystalbond 509.

13. The method of claim 12 wherein said two part adhesive is ALTAR Adhesive with activator #707.

14. The method of claim 11 wherein said two part adhesive is ALTAR Adhesive with activator #707.

* * * * *